United States Patent [19]

Wollesen

[11] 4,410,904

[45] Oct. 18, 1983

[54] NOTCHED CELL ROM

[75] Inventor: Donald L. Wollesen, Saratoga, Calif.

[73] Assignee: American Microsystems, Inc., Santa Clara, Calif.

[21] Appl. No.: 198,318

[22] Filed: Oct. 20, 1980

[51] Int. Cl.³ .............. H01L 27/10; H01L 27/02; H01L 29/78; G11C 17/00
[52] U.S. Cl. .............................. 357/45; 357/41; 357/59; 365/104; 148/1.5; 357/23
[58] Field of Search ............ 357/23 S, 41, 45; 365/104

[56] References Cited

U.S. PATENT DOCUMENTS

| 3,865,651 | 2/1975 | Arita | 357/45 |
| 4,192,014 | 3/1980 | Craycraft | 365/104 |
| 4,272,830 | 6/1981 | Moench | 357/41 |

*Primary Examiner*—Gene M. Munson
*Attorney, Agent, or Firm*—Alan H. MacPherson; Steven F. Caserza; Richard Franklin

[57] ABSTRACT

A semiconductor READ ONLY MEMORY (ROM) device is constructed by using a series of word lines as a mask during the fabrication of the underlying bit lines. The width of the word lines over each memory cell determines the characteristics of that cell (i.e. programmed or unprogrammed).

11 Claims, 9 Drawing Figures

NOTCHED CELL ROM

BACKGROUND OF THE INVENTION

1. Field of the Invention

This invention relates to semiconductor memory devices and more particularly to a MOS type READ ONLY MEMORY (ROM) device whose programmed cells of the memory array are determined by the gate configuration of the cell.

2. Description of the Prior Art

In READ ONLY MEMORY (ROM) devices, by definition, the device is fabricated with a predetermined custom ROM pattern of logical ones and logical zeros. Prior art ROM devices are disclosed in U.S. Pat. No. 3,191,151 entitled "Programmable Circuit", which issued June 22, 1965 to Price. Typically, diffused buried bit lines and overlying perpendicular conductive word lines are constructed on a semiconductor substrate wherein the word line provides a gate for each cell formed at the crossover intersection of a word line and a bit line (FIG. 2). To provide the ROM function of the device, certain of the memory cells must be permanently "off" or in the logical "one" condition while the other cells are capable of being turned on and off, or in the logical "zero" condition. Heretofore, in semiconductor ROM devices made according to conventional metal-oxide semiconductor (MOS) processes using the well-known metal gate technique, programmed cells are formed during a step fairly late in the process. An advantage in this process is that the manufacturer of such ROM devices could build an inventory of nearly finished parts and then perform the final steps when necessary to complete devices with a custom ROM pattern.

Because of other inherent advantages, such as greater speed, lower power consumption and smaller physical dimensions, the well-known silicon gate devices were later developed and are preferred over metal gate devices for certain applications. However, the silicon gate process requires the ROM pattern of active and inactive cells to be formed at a relatively early stage in the series of process steps, which eliminates the production advantage of metal gate ROM devices.

There thus arose a need for an improved MOS structure and process for making ROM devices that would retain the inherent advantages of silicon gate devices and yet allow the ROM to be comitted to a specific program pattern only after at least 50 to 60 percent of the process had been completed.

One general object of the present invention is to provide an improved metal-oxide semiconductor ROM device that solves the aforesaid problem.

Another object of the invention is to provide a semiconductor ROM device wherein the active and inactive cells once formed have a different geometrical configuration so that the ROM pattern for the device can be visually ascertained and checked. This cannot be done in many types of prior art ROMs.

Still another object of the invention is to provide a method for making an improved metal-oxide semiconductor device that has lower power characteristics and is particularly adaptable for implementation as a memory device.

BRIEF SUMMARY OF THE INVENTION

In accordance with the principles of this invention, a metal oxide semiconductor (MOS) READ ONLY MEMORY (ROM) is provided, comprising an array of memory cells formed at the crossover intersections of buried layer bit lines and overlying conductive word lines. At preselected intersections determined by the desired memory program, "programmed" cells are formed which are always conductive or in the "on" state. This is in contrast to the remaining "unprogrammed" cells, each of which is constructed as a fully functitonal transistor with the ability to become either conductive or non-conductive, based on the voltages applied thereto, according to well known properties of MOS transistors.

The programmed, or always conductive cells are constructed by forming a conductive word line which contains a narrowing, or notch, over the to-be-formed programmed cell. During fabrication of the underlying bit line, the word line acts as a mask. The notched portion of the word line is sufficiently narrow to allow side diffusion to form a continuous diffused bit line under the narrow portion of the word line. This results in a cell which is always conductive.

DETAILED DESCRIPTION OF THE INVENTION

Semiconductor devices which function as READ ONLY MEMORIES (ROMS) are well known in the prior art. These devices are designed and fabricated in such a manner as to contain an arry of semiconductor memory cells. Each memory cell contained in a ROM is either "programmed" or "unprogrammed" during construction of the device to provide two distinct states, usually represented as logical ones and logical zeroes. Appropriate addressing, control, and sense circuits are contained on the ROM chip to allow the state of each cell in the array to be determined. Such devices may not be programmed or unprogrammed once constructed, hence the name "READ ONLY MEMORY".

Figure 1:
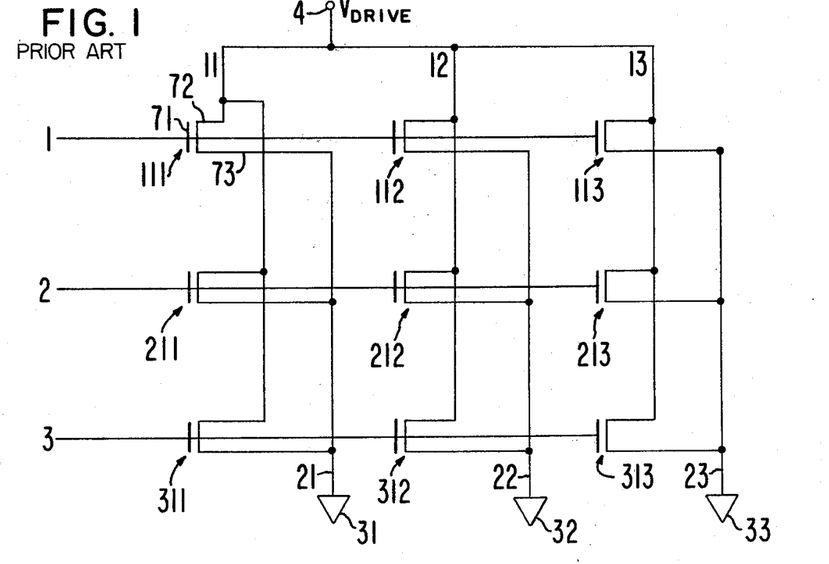
FIG. 1 is a schematic diagram of a portion of a prior art parallel access ROM device.

Prior art ROMS utilize an array of semiconductor memory cells. A typical schematic diagram for such a prior art ROM is shown in FIG. 1. Each cell of the memory array is comprised of a single MOS transistor.

In practice, these transistors must be formed in such a manner which allows differentiation between a "programmed" and an "unprogrammed" cell. The general method of doing this is to construct each unprogrammed cell in a manner such that it will function as a normal transistor, i.e., capable of being turned on and off, and to fabricate programmed cells which are incapable of being turned on. Referring again to FIG. 1, lines 1, 2 and 3 are called word lines. Two bit lines are required to access each cell. For example, line 11 is called the bit drive line for cells 111, 211 and 311 and line 21 is called the bit sense line for the same cells. Sense amplifier 31 is connected to sense line 21, and provides a voltage indicative of a logical one or a logical zero at its output, which is determined by the state (i.e., "programmed" or "unprogrammed") of the cell being accessed by the word line. In practice only one word line is accessed at a time and the word comprised of the bits contained in the memory cells connected to that word line are available as outputs from the sense amplifiers. For example, to read word number one contained in the memory array of FIG. 1, word line 1 is accessed by placing on it a voltage capable of turning on a fully functional transistor of the array when applied to its gate. In this manner, the voltage applied to terminal 4, the drive voltage, will appear on each bit drive line (11, 12, and 13) and will also appear on each bit sense line (21, 22, and 23) corresponding to each transistor of word line 1 which is capable of being turned on. Conversely, the drive voltage applied to terminal 4 will not be available on any of bit sense lines 21, 22 and 23 corresponding to a transistor cell on word line 1 which is incapable of being turned on. In this manner bit line sense amplifiers 31, 32, and 33 are capable of providing outputs of logical ones or logical zeroes corresponding to the programmed or unprogrammed state of each memory cell of word line 1. Each word may be read in this manner by individually accessing its word line. Because each memory cell on a bit line is connected in parallel, this type of array is often referred to as a parallel access ROM or a NOR ROM.

Figure 2A:
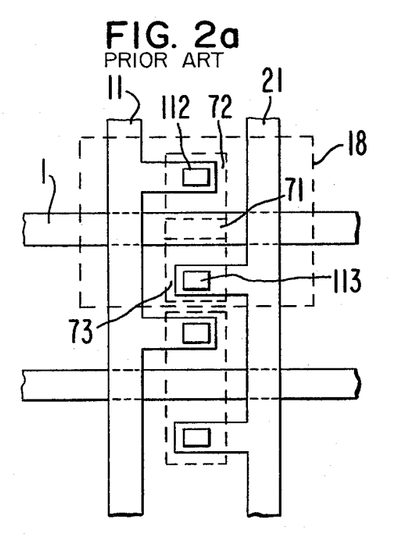
FIG. 2a is a fragmentary plan view showing a portion of a prior art parallel access semiconductor ROM.
Figure 2B:
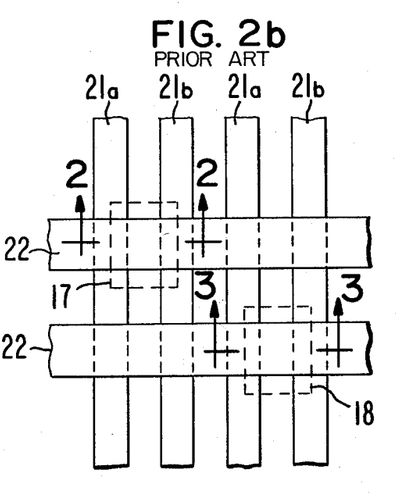
FIG. 2b is a fragmentary plan view showing a portion of a prior art parallel access semiconductor ROM which utilizes a dual thickness gate oxide.

ROMS are constructed on semiconductor material in such a manner that the word lines and the bit lines are formed at substantially right angles as shown in FIGS. 2a and 2b. In FIG. 2a, cell 18 is formed by diffused source region 72, diffused drain region 73 and gate region 71. Gate region 71 is controlled by word line 1. Source 72 is connected to bit drive line 11 via contact 112. Drain 73 is connected to bit sense line 21 via contact 113. In FIG. 2b, bit lines 21 are comprised of diffusions into semiconductor substrate 19. Word lines 22 are formed on top of substrate 19 and separated from substrate 19 by electrical insulating material. Each cell 17 and 18 of the array is formed beneath word line 22 and between a bit drive line 21a and its associated bit sense line 21b, as shown. In prior art ROMS, each word line is formed having a constant width across its length, as indicated in FIG. 2.

There are several prior art methods of fabricating the semiconductor memory array of FIG. 2a which contain such "programmed" and "unprogrammed" memory cells. On metal gate MOS devices the metal mask may serve as the program mask which determines which cells will be "programmed" and which cells will be "unprogrammed". For unprogramed cells which are capable of being turned on and turned off, the metal mask is formed in such a manner as to provide a connection between the bit sense line and the cell. In this manner the transistor will function properly and the drive voltage will be available on bit sense line 21 when the word line associated with that programmed cell is accessed. On the other hand, the metal mask can also be used to form cells which are incapable of being turned on and thus remain in the "programmed" state. For these "programmed" cells the metal interconnections are not made between the bit sense line and the cell. Thus, for programmed devices, the drive voltages will never be able to appear on the associated bit sense line.

Another method used to construct ROMS is to use the contact mask as the programmable layer. Thus, if both the source and the drain contact openings are etched through the insulation on top of the cell, the cell will be formed as a normal transistor connected to desired circuitry, and will be capable of being turned on and off. However, if one or both contact openings are not etched through the insulation above the cell, a programmed cell is formed which is incapable of being turned on, and thus will always be off.

Another method of forming a programmed cell in a parallel access ROM is to use ion implantation to form a gate region which is incapable of forming a conductive channel and thus incapable of turning on.

Figure 3:
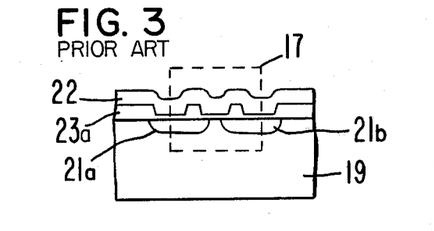
FIG. 3 is a view in section taken along line 2—2 of FIG. 2b.
Figures 4, 6:
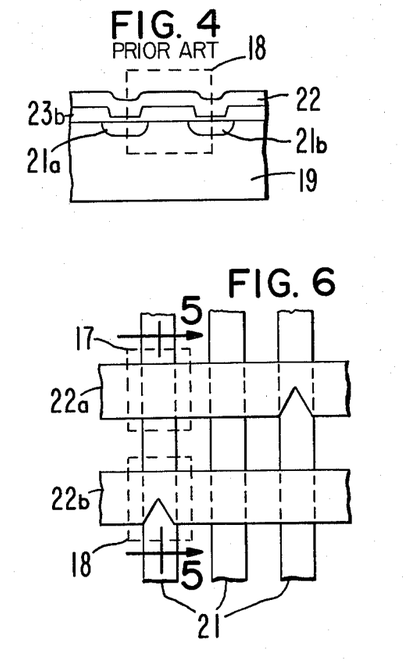
FIG. 4 is a view in section taken along line 3—3 of FIG. 2b.
FIG. 6 is a fragmentary plan view showing a portion of a serial access semiconductor ROM device in accordance with this invention.

Still another prior art method of providing both "programmed" and "unprogrammed" cells for use in a ROM is by utilizing a gate oxide of varying thickness in the structure shown in FIG. 2b. By utilizing a thin oxide region denoted as region 23d in FIG. 3, word line 22 is formed in close proximity to substrate 19 between bit lines 21a and 21b, thus allowing MOS transistor 17 to turn on and turn off when selected control voltages are applied to word line 22, which serves as the gate of cell 17. By utilizing a thick oxide as denoted by Region 23b of FIG. 4, word Line 22, which serves as the gate, is too distant from substrate 19 between bit lines 21a and 21b to cause an effective channel to be formed, unless extremely high gate voltage is used. Thus the programmed cell shown in FIG. 4 is incapable of being turned on by applying available drive voltages to its gate.

One objective when building ROM devices is to utilize a process in which the programming of the cells may take place very late in the processing. In this manner, a substantial inventory of devices may be built up which are fabricated up to the programming step. Thus, delivery times may be reduced from approximately 6 weeks (the time required to fabricate a device from semiconductor wafer starting material) to approximately 1 week (the time required to complete fabrication of a ROM which has already been constructed up to a late programming step). When a customer then places his order, this inventory may be used to provide ROM devices programmed to the customer's needs in a relatively short period of time. The best prior art methods of doing this is to utilize the metal mask as the programming step on metal gate devices, because the metal mask is one of the last steps taken in fabrication in metal gate devices.

Another objective in the construction of ROMS is provide a fast, low power device which is as dense as possible in order to minimize costs. Silicon gate devices are thus very popular because they are more dense, faster and require less power to operate than metal gate devices. The disadvantage associated with the construction of silicon gate ROMS is that the programming must occur at an earlier step in its fabrication, such as the contact mask. A greater number of fabrication steps are required after programming silicon gate devices than is required after programming metal gate devices. Thus, delivery time for silicon gate devices is several weeks greater than delivery time for metal gate devices. The present NAND ROM invention combines the advantages of the silicon gate devices of lower power comsumption and higher density than NOR ROMs, with the late programming abilities of the metal gate devices. The NAND ROM is normally slower in access time than NOR ROMs. In this manner higher density ROM devices can be obtained and delivery times reduced.

Figure 5:
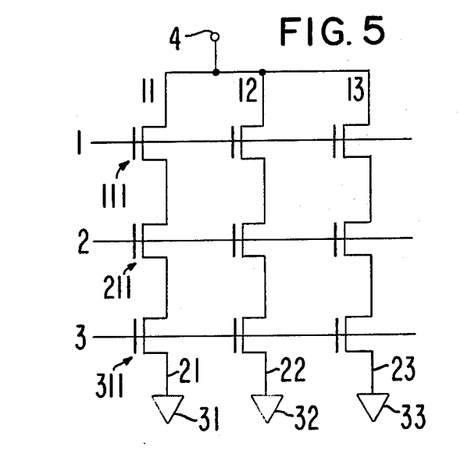
FIG. 5 is a schematic diagram of a portion of a serial access ROM device.

A schematic diagram for a serial access NAND ROM as used in the present invention is shown in FIG. 5. In FIG. 5 cells are connected in series along each bit line. For example, cells 111, 211 and 311 are all connected in series along bit line 11 between terminal 4 and sense amplifier 31. This type of array is referred to as a NAND ROM because each transistor along bit line 11 must be turned on in order for the drive voltage applied at terminal 4 to be available to sense amplifier 31.

In a serial access ROM an unprogrammed cell is formed by fabricating a normal transistor capable of being turned on and turned off and a programmed cell is formed by fabricating a transistor which is always on and cannot be turned off. Word lines 1, 2 and 3 are kept high except when being accessed, at which time a selected word line is connected to ground. For example, when word line 1 is selected, it is connected to ground and word lines 2 and 3 are connected high. Transistors 211 and 311 will thus conduct since their gates are high. If transistor 111 is an unprogrammed cell, i.e., one which is capable of being turned on and turned off, it will be off since its gate is connected to ground. Thus, the drive voltage applied to terminal 4 will not be available at sense amplifier 31. On the other hand, if transistor 111 is a programmed cell, i.e., one which is incapable of being turned off, the drive voltage applied to terminal 4 will be available at sense amplifier 31. The output state of sense amplifier 31 when word line 1 is selected will thus be indicative of whether transistor cell 111 is programmed or unprogrammed.

Figure 7:
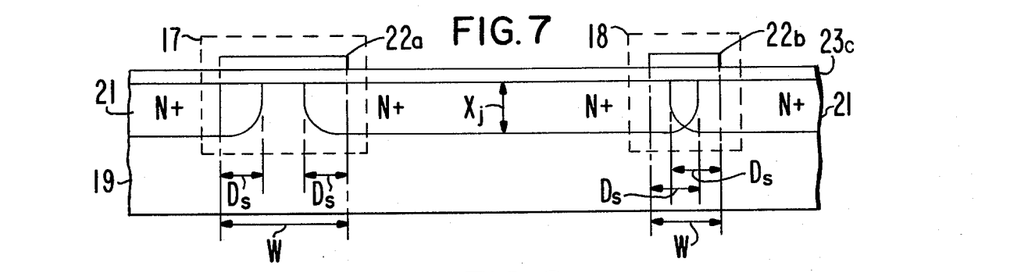
FIG. 7 is a view in section taken along line 5—5 of FIG. 6 of a serial access ROM device constructed in accordance with one preferred embodiment of the present invention.

A fragmentary top view of a serial access ROM is shown in FIG. 6. Because each cell requires connection to only one bit line, each of cell 17 and 18 are formed at the intersection of word lines 22a and 22b and bit lines 21. Each cell in a serial access ROM thus requires less space than each cell in a parallel access ROM. The present invention utilizes word lines of two different widths, as shown in FIG. 6, to construct cells which are programmed and cells which are unprogrammed. Unprogrammed cells which are capable of being turned on and turned off in a normal manner are denoted as cell 17, formed at each intersection of bit lines 21 and wide portions of word lines 22a and 22b. Programmed cells which are always on and incapable of being turned off are denoted as cell 18, as formed at each intersection of bit line 21 and the narrow portions of the word lines 22a and 22b. A cross-sectional view of unprogrammed cell 17 and programmed cell 18 fabricated in accordance with one preferred embodiment of this invention and taken along line 5—5 of FIG. 6, is shown in FIG. 7. Word lines 22a and 22b are formed on substrate 20 in a well known manner. Separating substrate 20 and word lines 22 is electrical insulation layer 23c. Bit lines 21 are then formed in substrate 19 with word lines 22a and 22b acting as a mask. Unprogrammed cell 17 is formed under the wide portion of word line 22a, thus forming a fully functional transistor. Programmed cell 18 is formed under the narrow portion of word line 22b.

Side diffusion is denoted as $D_S$ in FIG. 7. Side diffusion typically is equal to about 70 percent of the diffusion depth, denoted as $X_j$ on FIG. 7. Thus, total diffusion from both sides of word line 22 is 140 percent of $X_j$. Using a sufficiently narrow notched region, having a maximum width $W = 2(0.7X_j)$, bit line 21 is formed as a continuous diffused region under the word line over cell 18 due to side diffusion, thus resulting in a programmed "transistor" which cannot be turned off. In actuality, this programmed "transistor" is a uniformly doped bit line region which is always conductive irrespective of the voltage on word line 22b, which acts as a gate. In fabricating such devices, the width of gate 22b is preferably less than $2(0.7X_j)$, thus allowing substantial side diffusion overlap and thus programmed cells having uniform characteristics.

Figure 8:
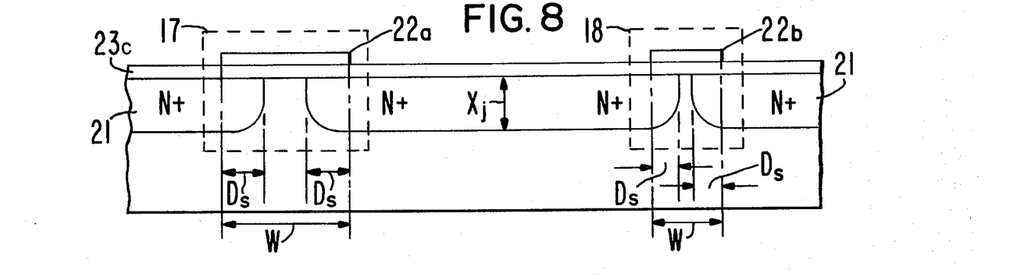
FIG. 8 is a view in section taken along lines 5—5 of FIG. 6 of a serial access ROM device constructed in accordance with a second preferred embodiment of the present invention.

Another preferred embodiment of this invention is shown in the cross-sectional view of FIG. 8. In this instance, unprogrammed cell 17 is formed as a fully functional MOS transistor, as previously described. Programmed cell 18 is formed in such a manner that side diffusion is insufficient to cause diffused bit line 21 to overlap under word line 22b which serves as the gate for cell 18. This may be accomplished by utilizing a notched portion of word line 22b that is wider than the maximum $2(0.7X_j)$ required for overlapping side diffusion of bit line 21 beneath word line 22b. Another method of fabricating bit lines in accordance with the second preferred embodiment is to construct the width of the programmed gate, W, to be slightly greater than $2(0.7X_j)$. Although the diffusions will not merge in this case, "PUNCHTHROUGH" voltage will be a sufficiently low voltage to allow the cell to function properly as a programmed cell.

While this second preferred embodiment results in unprogrammed cell 18 which is not always conductive, it has an extremely low punchthrough voltage (voltage required to cause breakdown between source and drain when the transistor is turned off.) This type of programmed cell will turn on in a normal fashion when a positive voltage is applied to word line 22b, which serves as its gate. Referring back to FIG. 5, a drive voltage is applied to terminal 4. If word number 1 is to be read, word lines 2 and 3 are connected high, causing cells 211 and 311 to turn on, whether they are programmed or unprogrammed. A low on word line 1 will cause cells connected it to turn off, including cell 111. If cell 111 is an unprogrammed cell, it will be off and have a very high punchthrough or source-drain breakdown voltage. This punchthrough voltage across cell 111 will be much higher than the drive voltage applied to terminal 4; thus cell 111 will not conduct. On the other hand, if cell 111 is a programmed cell, its punchthrough voltage will be much less than the drive voltage applied to terminal 4, and thus will conduct, allowing drive voltage to be available to sense amplifier 31 through bit sense line 21 and conducting cells 211 and 311.

Devices are constructed in accordance with both preferred embodiments of this invention by the following method. The array that was fabricated was constructed of P channel devices; either N channel or P channel devices may be used. A silicon wafer is used for the starting material. The surface of the silicon wafer is oxidized to a thickness of approximately 400 Å by subjecting the silicon wafer to oxygen with the temperature being ramped up to 1,000° C. within five minutes, holding the silicon wafer at 1,000° C. for 20 minutes in an atmosphere of O₂ and three percent HCl, followed by approximately 10 minutes at 1,000° C. in O₂ followed by a five minute ramp down in O₂. Nitride is then deposited on the oxidized layer of the silicon wafer to a depth of approximately 1,000 Å. This nitride is then oxidized with a five minute ramp up in O₂, followed by 30 minutes in O₂ at approximately 950° C., followed by five minute ramp down in O₂. This silicon nitride layer serves as an isolation region between each cell contained in the to-be-formed memory. The field is then implanted using arsenic as the doping material to a dose of approximately 6×10⁰ μC. This field is then oxidized to a thickness of approximately 11,000 Å using a five minute ramp up in O₂ followed by 15 minutes in O₂ at approximately 1,000° C. followed by approximately six hours in steam at approximately 1,000° C., followed by approximately 10 minutes in O₂ at 1,000° C., followed by a five minute ramp down in O₂. For a CMOS process, the P-wells are then diffused using a five minute ramp up to 950° C. followed by 16.5 hours at 1200° C. followed by a five minute ramp down from 950° C. Silicon nitride and the thin layer of silicon dioxide under it are then removed from areas where gates are to be formed. Gate oxide is then grown in these regions to approximately 830 Å by subjecting the wafer to a five minute ramp in O₂ to 1,000° C., followed by 70 minutes in O₂ and three percent HCl at approximately 1,000° C., followed by 15 minutes in N₂ at 1,000° C. followed by a 10 minute ramp down in N₂. Gate regions are then doped with boron using ion implantation with a dose of approximately $0.7 \times 10^0$ μC at 40 KEV. Polycrystalline silicon word lines are then deposited to a thickness of approximately 4,000 angstroms using well known techniques. Dopant phosphorous is then deposited on said polycrystalline silicon to a dosage of solid solubility. Dopant boron is then deposited on the to-be-formed source and drain regions, comprising the bit lines, to a resistivity of approximately 7 ohms from a BBr₃ source at approximately 1,025° C. for 20 minutes. Source and drain regions are then oxidized to approximately 1,000 Å using a five minute ramp up in dry O₂ to 950° C., 10 minutes in wet O₂ at approximately 950° C., 10 minutes in dry O₂ at approximately 950° C. followed by a five minute ramp down in dry O₂. Contacts are then formed in a well known manner and metallization interconnects are deposited on the surface of the wafer, also in well known manners.

The specific shape of the notch is not critical to the fabrication of programmed memory cells in devices constructed in accordance with this invention. The notch may take the V shape as shown in FIG. 6, a rectangular shape, or the notch may be made in the shape of a U, etc. The notch may also be formed by symetrical or nonsymetrical indentations along both edges of the word line, as long as the width at the narrowest part above the unprogrammed cell is sufficiently small as to allow adequate side diffusion of the underlying bit line. A V type notch may be preferred in order to minimize the decrease in conductivity of the word line caused by narrowing at the notches.

This invention allows silicon gate MOS ROMS to be constructed utilizing the word lines as the programming mask for committing the semiconductor memory array to a specific programmed pattern. Because fabrication of the word lines is a late step in the construction of ROM devices, improved delivery times of silicon gate ROMS is obtained while maintaining the speed, power and density advantages characteristic of silicon gate devices over their metal gate counterparts.

A further advantage of both preferred embodiments of the present invention is that the program contained in the ROM cells may be determined visually by viewing the semiconductor die through a microscope and ascertaining the location of the notched or narrow portions of word lines 22. In many prior art serial access ROM devices, each cell was visually indistinguishable. In the present invention, cells formed with notched portions of word lines 22 are programmed, and thus contain a stored value of logical one. Cells formed with wide portions of word lines 22 are unprogrammed and represent a value of logical zero. Often during the manufacturing of ROM devices, a quick visual program check is preferred over a method requiring the use of wafer probes, electrical test equipment and/or computer test systems.

I claim:

1. A serial access MOS ROM comprised of:
   a semiconductor substrate of a first conductivity type;
   a plurality of buried regions formed in said substrate serving as bit lines of an opposite conductivity type;
   a layer of electrical insulating material covering said bit lines;
   a plurality of conductive paths serving as word lines lying substantially perpendicular above said bit lines and separated from said bit lines by said insulating material;
   a plurality of semiconductor memory cells formed at each cross-over of said bit lines and said word lines, said plurality of conductive paths having narrowed width portions at selected ones of said cross-overs; and
   wherein said word lines serve as a mask during the formation of said bit lines and the width of each of said word lines at each cross-over of said word line and said bit line determine the logical state of the cell formed at that cross-over.

2. Structure as in claim 1 wherein said word lines are comprised of conductive regions of a first width interspersed with selected regions of a second width forming said narrowed width portions at multiple selected cross-overs, said second width being less than said first width.

3. Structure as in claim 1, wherein said regions of said second width comprise notches and said notches have a U shape.

4. Structure as in claim 2, wherein said regions of said second width comprise notches and said notches have a rectangular shape.

5. Structure as in claim 2, wherein cells formed at the cross-overs of bit lines and portions of word lines having said first width are fully functional MOS transistors, and cells formed at the cross-overs of bit lines and said portions of word lines having said second width are always conductive.

6. Structure as in claim 5 wherein said always conductive cells are formed with a continuous bit line under said portions of said word lines having said second width.

7. Structure as in claim 2, wherein cells formed at the cross-overs of bit lines and portions of word lines having said first width are fully functional MOS transistors, and cells formed at the cross-overs of bit lines and said portions of said word lines having said second width are transistors having extremely low source to drain punchthrough voltage in the "off" state, and thus will always conduct when read.

8. A programmed semiconductor memory cell contained in read only memory comprised of a plurality of semiconductor memory cells located on a semiconductor substrate of a first conductivity type, said programmed semiconductor memory cell comprising:
an underlying buried region of opposite conductivity type formed in said substrate serving as a bit line;
a layer of electrical insulating material covering said bit line;
a conductive path having a first width serving as a word line lying substantially perpendicular above said bit line and forming cross-overs therewith, said word line being separated from said bit line by said insulating material, wherein said word line serves as a mask during the formation of said bit line, and the width of said word line at ones of said cross-overs of said bit line being of a second width narrower than said first width, thus forming a cell which is always conductive.

9. A serial access MOS ROM comprised of: a semiconductor substrate of a first conductivity type;
a plurality of buried regions formed in said substrate serving as bit lines of an opposite conductivity type;
a layer of electrical insulating material covering said bit lines;
a plurality of conductive paths having nonuniform widths, said plurality of conductive paths serving as word lines lying substantially perpendicular above said bit lines and separated from said bit lines by said insulating material;
a plurality of semiconductor memory cells formed at each cross-over of said bit lines and said word lines;
wherein said word lines serve as a mask during the formation of said bit lines and the width of each of said word lines at each cross-over of said word line and said bit line determine the logical state of the cell formed at that cross-over;
said word lines of nonuniform width comprising conductive regions of a first width interspersed with selected regions of a second width, said second width being less than said first width; and
wherein cells formed at the cross-overs of bit lines and portions of word lines having said first width are fully functional MOS transistors, and cells formed at the cross-overs of bit lines and said portions of word lines having said second width are always conductive.

10. Structure as in claim 9 wherein said always conductive cells are formed with a continuous bit line under said portions of said word lines having said second width.

11. A serial access MOS ROM comprised of:
a semiconductor substrate of a first conductivity type;
a plurality of buried regions formed in said substrate serving as bit lines of an opposite conductivity type;
a layer of electrical insulating material covering said bit lines;
a plurality of conductive paths having nonuniform widths, said plurality of conductive paths serving as word lines lying substantially perpendicular above said bit lines and separated from said bit lines by said insulating material;
a plurality of semiconductor memory cells formed at each cross-over of said bit lines and said word lines;
wherein said word lines serve as a mask during the formation of said bit lines and the width of each of said word lines at each cross-over of said word line and said bit line determine the logical state of the cell formed at that cross-over;
said word lines of nonuniform width comprising conductive regions of a first width interspersed with selected regions of a second width, said second width being less than said first width; and
wherein cells formed at the cross-overs of bit lines and portions of word lines having said first width are fully functional MOS transistors, and cells formed at the cross-overs of bit lines and said portions of word lines having said second width are transistors having extremely low source to drain punchthrough voltage in the "off" state, and thus will always conduct when read.

* * * * *

UNITED STATES PATENT AND TRADEMARK OFFICE
CERTIFICATE OF CORRECTION

PATENT NO. : 4,410,904
DATED : October 18, 1983
INVENTOR(S) : Donald L. Wollesen It is certified that error appears in the above—identified patent and that said Letters Patent is hereby corrected as shown below:

Column 2, line 55, delete "arry" and insert --array--.

Column 4, line 29, delete "23d" and insert --23a--.

Claim 1 should read as follows:

1. A serial access MOS ROM comprised of:

a semiconductor substrate of a first conductivity type;

a plurality of buried regions formed in said substrate serving as bit lines of an opposite conductivity type;

UNITED STATES PATENT AND TRADEMARK OFFICE
CERTIFICATE OF CORRECTION

PATENT NO. : 4,410,904

DATED : October 18, 1983

INVENTOR(S) : Donald L. Wollesen

It is certified that error appears in the above—identified patent and that said Letters Patent is hereby corrected as shown below:

a layer of electrical insulating material covering said bit lines;

a plurality of conductive paths serving as word lines lying substantially perpendicular above said bit lines and separated from said bit lines by said insulating material;

a plurality of semiconductor memory cells formed at each cross-over of said bit lines and said word lines, said plurality of conductive paths having narrowed width portions at selected ones of said cross-overs;

wherein said word lines comprise conductive regions of a first width interspersed with selected regions of a second width forming said narrowed width portions, said second width being less than said first

UNITED STATES PATENT AND TRADEMARK OFFICE
CERTIFICATE OF CORRECTION

PATENT NO. : 4,410,904
DATED : October 18, 1983
INVENTOR(S) : Donald L. Wollesen It is certified that error appears in the above—identified patent and that said Letters Patent is hereby corrected as shown below:

width, said word lines serve as a mask during the formation of said bit lines and the width of each of said word lines at each cross-over of said word lines and said bit line determine the logical state of the cell formed at that cross-over, and cells formed at the cross-overs of bit lines and said portions of word lines having said second width are always conductive.

Delete Claim 2 in its entirety and substitute the following:

2. Structure as in Claim 1, wherein said regions of said second width comprise notches and said notches have a V shape.

UNITED STATES PATENT AND TRADEMARK OFFICE
CERTIFICATE OF CORRECTION

PATENT NO. : 4,410,904
DATED : October 18, 1983
INVENTOR(S) : Donald L. Wollesen It is certified that error appears in the above—identified patent and that said Letters Patent is hereby corrected as shown below:

Claim 4, Column 8, line 50, delete "2" and insert --1--.

Claim 7, Column 8, line 63, delete "2" and insert --1--.

Signed and Sealed this

Thirtieth Day of October 1984

[SEAL]

Attest:

GERALD J. MOSSINGHOFF

Attesting Officer

Commissioner of Patents and Trademarks